United States Patent [19]
Golla et al.

[11] Patent Number: 5,724,395
[45] Date of Patent: Mar. 3, 1998

[54] METHOD AND APPARATUS FOR FILTERING DIGITAL SIGNALS

[75] Inventors: Carla Golla, Sesto San Giovanni; Alessandro Cremonesi, S. Angelo Lodigiano, both of Italy

[73] Assignee: SGS-Thomson Microelectronics S.r.l., Agrate Brianza, Italy

[21] Appl. No.: 188,569

[22] Filed: Jan. 28, 1994

[30] Foreign Application Priority Data

Jan. 29, 1993 [EP] European Pat. Off. .............. 93830032

[51] Int. Cl.$^6$ .................................................. H04B 1/10
[52] U.S. Cl. ................. 375/350; 364/724.01; 364/724.16
[58] Field of Search .......................... 375/11, 14, 15, 375/75, 99, 102, 103, 229, 285, 346, 350; 364/724.01, 724.13, 724.16, 724.17

[56] References Cited

U.S. PATENT DOCUMENTS

| | | | |
|---|---|---|---|
| 4,866,648 | 9/1989 | Usui ...................... | 364/724.01 |
| 4,868,773 | 9/1989 | Gyle et al. .............. | 364/724.01 |
| 5,016,207 | 5/1991 | Fujii et al. .............. | 364/724.01 |
| 5,222,035 | 6/1993 | Nakasae et al. ........... | 364/724.16 |

OTHER PUBLICATIONS

IEEE Transactions on Consumer Electronics, vol. 33, No. 3, Aug. 1987, New York, US, pp. 129–134. I.A. Shah, et al. "A Fast Multiplierless Architecture For General Purpose VLSI Fir Digital Filters".

Radio and Electronic Engineer, vol. 46, No. 8/9, Aug. 1976, London, GB, pp. 393–400. M.A. Bin Nun, et al., "A Modular Approach to the Hardware Implementation of Digital Filters".

IEEE Journal of Solid-State Circuits, vol. 25, No. 6, Dec. 1990, New York, US, pp. 1502–1509. Carla Golla, et al., "30-MSamples/s Programmable Filter Processor".

Primary Examiner—Stephen Chin
Assistant Examiner—Amanda T. Le
Attorney, Agent, or Firm—Wolf, Greenfield & Sacks, P.C.; James H. Morris

[57] ABSTRACT

A method of filtering digital signals having a high dynamic range includes splitting the sampled input signal into at least two portions addressing each of the portions to a respective program filter, and performing each filtering operation in parallel and independently, and reconstituting an output signal by summing together the digital outputs from each filter.

9 Claims, 2 Drawing Sheets

METHOD AND APPARATUS FOR FILTERING DIGITAL SIGNALS

BACKGROUND OF THE INVENTION

1. Field of the Invention

This invention relates to a method of filtering digital signals having a high dynamic range; that is, signals encoded with a large number of bits. The invention also concerns a digital filter architecture obtained according to that method. The field of application of the invention is particularly, though not exclusively, related to digital filters of the non-recursive linear phase type, also known as FIR (Finite Impulse Response) filters, and the description hereinbelow will make reference to that field of application merely for convenience of illustration.

2. Discussion of the Related Art

As is well known, digital filters are devices operative to convert an input sampled signal into another sampled, output signal having predetermined frequency response characteristics. A sampled signal is understood to mean a digital coding including a predetermined number N of bits which determines the accuracy or resolution of the filter. Digital filters are used primarily in digital oscilloscopes, spectrum analyzers, and audio and video signal processors. The use of such filters is an ever expanding one, on account of the many advantages that they afford over corresponding analog filters. For the same function, in fact, digital filters provide for achieving very narrow transmission bands and are also stabler, both over time and with respect to variations in power supply and operating temperature.

In current practice, digital filters are implemented in the form of integrated circuits using digital multipliers and adders. Digital multipliers may be arranged to include a non-volatile memory structure of the so-called "look-up table" type, wherein the multiplication results of the input sample signals by the filter transfer function coefficients are stored. Such a structure is described, for example, in an article "30-MSamples/s Programmable Filter Processor", IEEE Journal of Solid-State Circuits, Vol. 25, No. 6, December 1990, and in Italian Patent Application No. 22954-A/88 by the same Applicant.

While being in many ways advantageous, this prior approach still includes the drawback discussed hereinbelow. If "n" is the number of bits used to sample the input signal, "N" is the overall number of the filter coefficients, and "p" is the number of bits required for storing the multiplication result of the samples by the coefficients, then the memory size is found to be 2nNp. It is clear from the above that to increase, even by a single bit, the sampled description of the input signal in order to increase the filter resolution, one must double the size of the memory.

Consider, for example, a hypothetical transition from an 8-bit sampling, typical in current practice, to a n=12 bits sampling—such as would be highly desirable in order to improve the filter performance with audio and video signals. A hypothetical memory structure suitable for that purpose would have to be sixteen times as large as that required by the first-mentioned 8-bit coding. Such a memory would, therefore, take up an extraordinarily high amount of space on an integrated circuit. In addition, it would have an insufficient data accessing speed because of access time being heavily dependent on both the increased coding complexity and the memory size, specifically the number of bits per row.

The prior art has failed to provide any useful solution to overcome the need for so great a memory expansion, when improved filter accuracy or resolution is sought. The technical problem underlying this invention is to provide a filtering method and a digital filter for use therewith, having such functional and structural features as to enable high-resolution processing of digital sampled signals encoded with a large number of bits, thereby overcoming the limitations of the prior art approaches.

SUMMARY OF THE INVENTION

The present invention provides for splitting the coding of the sampled signal into portions of at least eight bits each, filtering each portion, one independently of the other, by means of respective digital filters, and then reconstituting the output sampled signal. With the present invention, the technical problem is solved by a filtering method including splitting an input sampled signal into at least two portions, addressing each of the portions to a respective program filter, performing the filtering operations on the portions in parallel and independently, and reconstituting an output signal by summing together digital outputs from each filter.

BRIEF DESCRIPTION OF THE DRAWINGS

The features and advantages of the inventive method will become more clearly apparent from the following detailed description of an exemplary, non-limitative embodiment thereof, given with reference to a digital filter architecture illustrated by the accompanying drawings.

DETAILED DESCRIPTION

Figure 1:
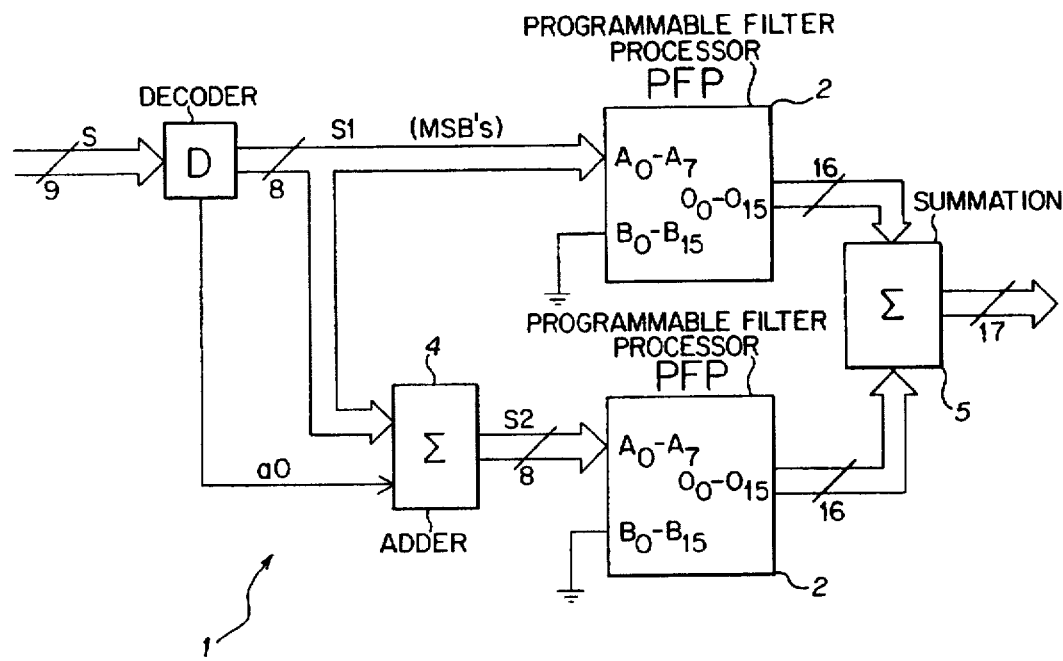
FIG. 1 shows schematically a digital filter architecture embodying this invention.

With reference to the drawing figures, generally and diagrammatically shown at 1 is a digital filter architecture which embodies this invention and is effective to filter digital signals having high dynamic ranges. Basically, the architecture 1 can operate with digital signals S encoded with at least k bits, where k may be any number between eight and sixteen. This architecture 1 has a predetermined number of programmable digital filters 2 denoted by the acronym PFP. Such filters 2 have a structure known per se and described, for example, in Italian Patent Application 22954-A/88 by this Applicant.

Each filter 2 receives a given eight-bit sampled signal x(n), and outputs another sampled signal y(n) having a predetermined frequency response characteristic. The filter 2 is a so-called linear phase FIR (Finite Impulse Response) type, which means that, at each discrete time, the input signal x(n) and the output signal y(n) will be tied by the following relation:

$$y(n) = \sum_{i=0}^{N-1} a(i) \times (n-i) \quad (1)$$

from which it may be deduced that the output sample y(n) is only dependent on the present and past input samples. The coefficients a(i) are a finite number N and are obtainable from the response to the filter pulse. Furthermore, the filter 2 may be identified by a so-called transfer function H(z), expressed versus a complex variable z and defined as the ratio H(z) of the-transform Z of a sequence of output sampled signals y(nT) to the transform Z of a sequence of input sampled signals x(nT). The circuit-wise synthesis of that transfer function practically enables implementation of the filter 2 as a single PFP integrated circuit, whereby for each digital input x(n), an output y(n) given by equation (1) would be produced.

The signal inputs to the filter 2 are denoted by A0, . . . . A7, whilst the digital outputs are denoted by O0, . . . . O15. Advantageously, the architecture 1 includes a number m=2 of filters 2, where n=(k-8), in parallel with one another. Each filter 2 has the same transfer function.

The architecture of this invention exploits the ability of each filter 2 to handle a digital signal quantized to eight bits. To this purpose, the input signal S is split into m portions, each represented by an eight-bit coding.

As shown in FIG. 1, the signal S is applied to a decoder D which selects the eight most significant bits and outputs a signal S1. This signal S1 is a first component of the original signal S, and is applied directly to the inputs A0, . . . , A7 of a first filter 2. The signal S1 is also applied to a adder block 4 which receives on another input, the bit having the greatest weight of the least significant portion of the signal S resulting from the selection performed in block D.

As the embodiment shown in FIG. 1 represents an instance where the signal S has a nine-bit coding, a single bit a0, the very least significant bit in the S coding, will be transferred from the decoder D to the adder 4. Thus, at the output of the adder 4, a second, eight-bit signal S2 is produced which will be addressed to the input side of a corresponding second PFP filter. The outputs from the first and second filters are summed together in a block 5 to reconstitute the output signal correctly.

For the purpose of showing a more general aspect of the inventive concept, it is noted that when a higher dynamic range is provided for the input signal S, i.e. the signal is encoded with a larger number of bits, it will be sufficient to merely increase the numbers of the filters 2 and the adders 4 arranged in parallel.

The filtering method of this invention provides for the output sample signal to be found by the following computation:

$$y(n) = \sum_{i=0}^{N-1} a(i) \left[ \sum_{h=0}^{m-1} \times h(n-i) \right] \quad (2)$$

where, N is the filter size, k is the dynamic range of the input signal, and m is equal to $2^{(k-8)}$.

To further describe how the inventive method can be carried out, the instance will now be discussed of an input signal S being encoded with ten bits. As a consequence, S is a digital signal having a value of from 0 and 1020 and which should be split, in accordance with the inventive method, into $m=2^{(10-8)}=4$ signal components, each with an eight-bit coding. If S is expressed as a sequence of bits aj, each with an indication of its respective weight, it is found that:

S=a9 a8 a7 a6 a5 a4 a3 a2 a1 a0

Hence, the four components into which that signal can be split are:

S1=INT [S/4]

S2=INT [S/4]+a2

S3=INT [S/4]+a1

S4=INT [S/4]+a0 where, INT is a symbol representing the integer value of the ratio in brackets.

Each component is encoded with eight bits, and is addressed to the input side of a corresponding filter 2 to be filtered in .accordance with the specifications of a predetermined transfer function. The outputs of the various parallel-connected filters 2 are summed together to reconstitute the proper coding sequence for the output signal.

Figure 2:
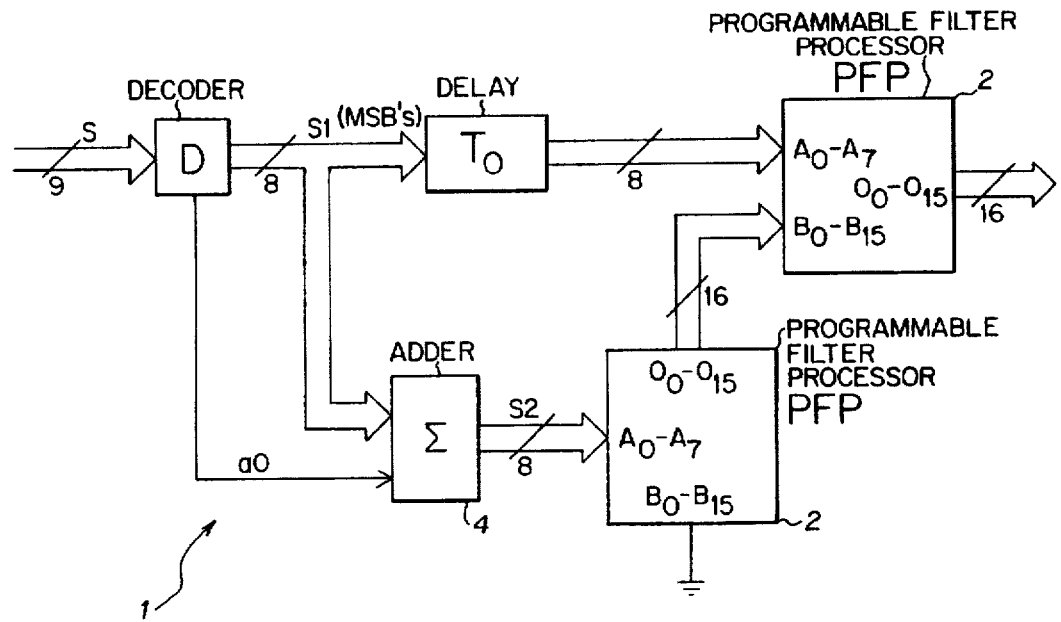
FIG. 2 is a schematic view of a second embodiment of the filter shown in FIG. 1.

In an alternative embodiment shown in FIG. 2, the possibility of performing the final sum through the same integrated circuits which make up the filters 2, is exploited. The filters 2 have, in fact, a second set of inputs, denoted by B0, . . . . B15, which usually receive a carry digital signal in those applications where the filters 2 are connected in series to one another. In the present embodiment, the outputs of the second filter, that is the one operative to filter the least significant component of the signal S, are connected directly to the carry inputs B0, . . . , B15 of the preceding filter.

Likewise, the outputs of a filter occupying the m-th position may be connected to such second inputs of the filter in the m-1 position. In this way, the final summing operation of the codings being output from the various filters can be performed internally of each circuit 2.

This alternative embodiment of the invention is made possible by the provision of a delay block T between the output of the decoder D and the first eight inputs of the first filter. The delay introduced by the block T is equivalent to the time period required by the filter 2 to process the signal.

The architecture and method described in the foregoing description are most advantageous where the input signal S is encoded with nine bits. In this case, in fact, no more than two PFP filters in parallel are needed to achieve highly accurate filtering within a very short time.

Obviously, any increase in the dynamic range of the input signal enhances the circuit complexity. On the other hand, it should not be overlooked that the integrated circuits making up the filters 2 are available at a fairly low price. Accordingly, the method of this invention has a major advantage in that it enables plural PFP filters, of well-proven reliability, to be used in lieu of alternative approaches which are much more costly either at design or at production level.

A second embodiment of the architecture and associated filtering method according to the invention, will now be described with specific reference to the examples shown in FIGS. 3 and 4. In this embodiment, cooperating parts and details which have the same construction and operate in the same manner as in the first embodiment are denoted by the same reference numerals.

Figure 3:
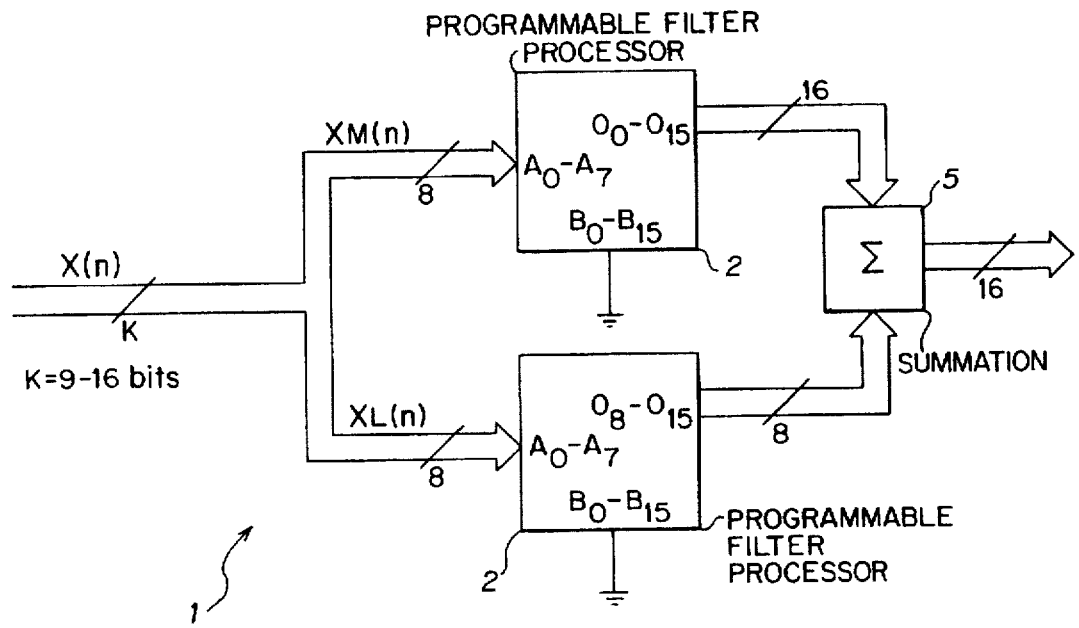
FIG. 3 is a schematic view of an alternative embodiment of a filter according to the invention.

With reference to FIG. 3, it can be seen that the input signal X(n), sampled at k bits—with k being anything between eight and sixteen bits—is split into two portions XM(n) and XL(n) of eight bits each. These signal portions respectively represent the most significant and least significant parts of the digital coding that constitutes the input signal. Each portion, XM(n) and XL(n) of the input signal is applied directly to the inputs A0, . . . , A7 of corresponding PFP filters. The outputs of such filters are summed together at block 5 to reconstitute the output signal Y(n).

Figure 4:
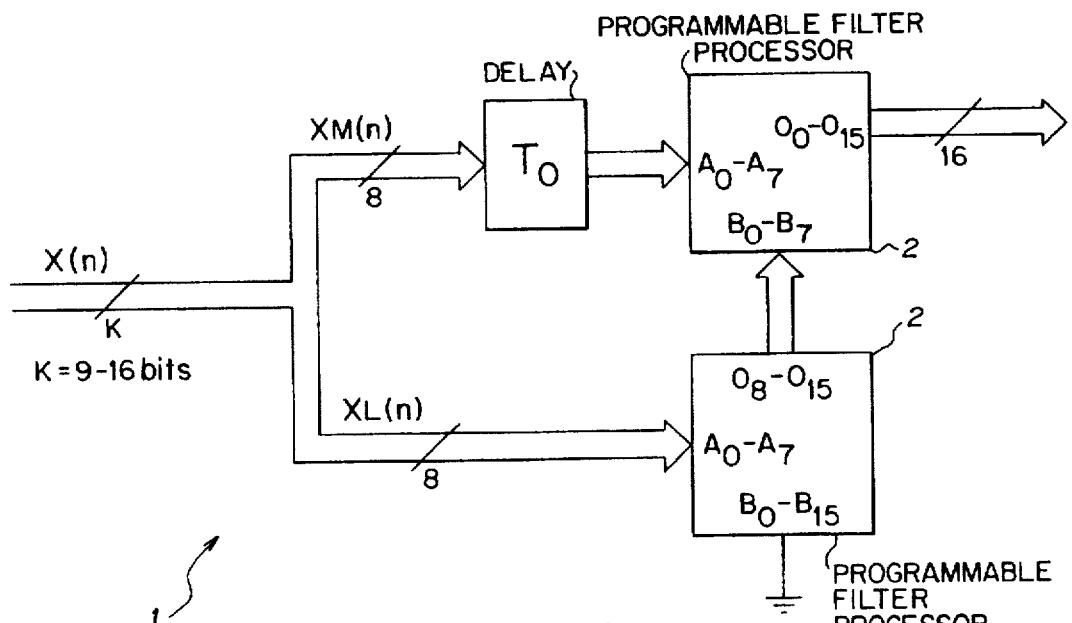
FIG. 4 is a schematic view of a second embodiment of the filter shown in FIG. 3.

Shown in FIG. 4 is another alternative embodiment wherein the outputs O8, . . . . O15 of the second filter are connected to the carry inputs B0, . . . . B7 of the first filter. In addition, a delay block T is placed ahead of the inputs A0, . . . . A7 to compensate for the delay in presenting the output signal by the second filter.

Note that the signal X(n) splitting criteria lead to the selection of the following digital sequences:

X1(n)=X(n) MOD 2(k-8)

and $$X2(n)=X(n)-X1(n)$$

where, MOD is the module operation.

By transposing the above two portions into an eight-bit coding, the following is obtained:

$$Xn(n)=X1(n) \, 2(16\text{-}k)$$

$$XM(n)=X2(n) \, 2(8\text{-}k)$$

As in the previous example, this second way of implementing the method of this invention is also based on the assumption that the digital signal is resolved into at least two eight-bit portions, complementary of one another, each portion being filtered independently of the other. The output signal may be then reconstituted using either external adders or the intrinsic capability of the integrated filters 2 to perform sums between digital codings, one of which codings would be received at the carry inputs. Compared to the previous embodiment, this variation of the inventive method affords considerable savings in hardware. In fact, a sixteen-bit signal can now be processed using two processors only, instead of $2^8$.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method of filtering digital signals having a high dynamic range comprising the steps of:

splitting an input sampled signal into at least two portions;

addressing each of the at least two portions to a corresponding respective program filter;

performing filtering operations on the portions in parallel and independently in the program filters;

producing an output signal by summing together digital outputs from each program filter;

wherein the step of producing the output signal includes a step of connecting digital outputs of one filter to carry inputs of a preceding filter to sum the digital outputs; and wherein the step of splitting the input sampled signal includes steps of selecting, as a first portion, eight most significant bits of the input signal and obtaining other portions from a parallel sum of the first portion and each remaining bit of the input sampled signal.

2. A method as claimed in claim 1, wherein the step of splitting the input sampled signal includes a step of splitting the input sampled signal into at least two portions of eight bits each.

3. A method as claimed in claim 2, wherein the step of performing filtering operations includes a step of performing the filtering operations with $2^n$ program filters, where n is a difference between a number of bits in the input signal and a number of bits of the program filter.

4. A method as claimed in claim 1, wherein the step of performing filtering operations includes a step of performing the filtering operations with $2^n$ program filters, where n is a difference between a number of bits in the input signal and a number of bits of the program filter.

5. A high resolution digital filter comprising:

an input terminal receiving an input digital signal;

means, coupled to the input terminal, for splitting the input digital signal into separate portions;

a plurality of processors arranged in parallel, coupled to the means for splitting, each processor receiving a single portion of the input digital signal and converting that portion into a processor output signal having predetermined frequency response characteristics, a last one of the plurality of processors providing an output of the digital filter;

a plurality of summing blocks arranged in parallel, coupled between the means for splitting and a respective processor, each summing block receiving a first portion of the input digital signal and a single bit of a remaining portion of the input digital signal and providing portions of the input digital signal to respective processors;

wherein the means for splitting includes a decoder; and wherein the outputs of one processor are coupled to carry inputs of a preceding processor.

6. A high resolution digital filter comprising:

an input terminal receiving an input digital signal;

means, coupled to the input terminal, for splitting the input digital signal into separate portions;

a plurality of processors arranged in parallel, coupled to the means for splitting, each processor receiving a single portion of the input digital signal and converting that portion into a processor output signal having predetermined frequency response characteristics, a last one of the plurality of processors providing an output of the digital filter;

a plurality of summing blocks arranged in parallel, coupled between the means for splitting and a respective processor, each summing block receiving a first portion of the input digital signal and a single bit of a remaining portion of the input digital signal and providing portions of the input digital signal to respective processors;

wherein the means for splitting includes a decoder that separates coding of eight most significant bits of the input digital signal from remaining bits of the input digital signal; and wherein the outputs of one processor are coupled to carry inputs of a preceding processor.

7. A high resolution digital filter, comprising;

an input terminal receiving an input digital signal;

means, coupled to the input terminal, for splitting the input digital signal into separate portions;

a plurality of processors arranged in parallel, coupled to the means for splitting, each processor receiving a single portion of the input digital signal and converting that portion into a processor output signal having predetermined frequency response characteristics, a last one of the plurality of processors providing an output of the digital filter;

a plurality of summing blocks arranged in parallel, coupled between the means for splitting and a respective processor, each summing block receiving a first portion of the input digital signal and a single bit of a remaining portion of the input digital signal and providing portions of the input digital signal to respective processors; and wherein the outputs of one processor are coupled to carry inputs of a preceding processor.

8. A high resolution digital filter comprising:

an input terminal receiving an input digital signal;

means, coupled to the input terminal, for splitting the input digital signal into separate portions;

a plurality of processors arranged in parallel, coupled to the means for splitting, each processor receiving a single portion of the input digital signal and converting that portion into a processor output signal having predetermined frequency response characteristics, a last one of the plurality of processors providing an output of the digital filter;

a plurality of summing blocks arranged in parallel, coupled between the means for splitting and a respective processor, each summing block receiving a first portion of the input digital signal and a single bit of a remaining portion of the input digital signal and providing portions of the input digital signal to respective processors;

wherein the means for splitting includes a decoder;

wherein the outputs of one processor are coupled to carry inputs of a preceding processor; and wherein the plurality of processors include $2^n$ processors where n is a number of bits in the input digital signal in excess of 8.

9. A high resolution digital filter comprising:

an input terminal receiving an input digital signal;

means, coupled to the input terminal, for splitting the input digital signal into separate portions;

a plurality of processors arranged in parallel, coupled to the means for splitting, each processor receiving a single portion of the input digital signal and converting that portion into a processor output signal having predetermined frequency response characteristics, a last one of the plurality of processors providing an output of the digital filter;

a plurality of summing blocks arranged in parallel, coupled between the means for splitting and a respective processor, each summing block receiving a first portion of the input digital signal and a single bit of a remaining portion of the input digital signal and providing portions of the input digital signal to respective processors;

wherein the means for splitting includes a decoder that separates coding of eight most significant bits of the input digital signal from remaining bits of the input digital signal;

wherein the outputs of one processor are coupled to carry inputs of a preceding processor; and wherein the plurality of processors include $2^n$ processors where n is a number of bits in the input digital signal in excess of 8.

\* \* \* \* \*

UNITED STATES PATENT AND TRADEMARK OFFICE
CERTIFICATE OF CORRECTION

PATENT NO. : 5,724,395

DATED : March 3, 1998

INVENTOR(S): Carla Golla and Alessandro Cremonesi

It is certified that error appears in the above-identified patent and that said Letters Patent is hereby corrected as shown below:

In column 5, line 8 should read:

$XL(n) = X1(n)\ 2(16-k)$

Signed and Sealed this

Fifth Day of May, 1998

*Attest:*

BRUCE LEHMAN

*Attesting Officer*      *Commissioner of Patents and Trademarks*